United States Patent [19]

Zwack

[11] Patent Number: 4,893,097
[45] Date of Patent: Jan. 9, 1990

[54] METHOD FOR TEMPERATURE COMPENSATION OF A VOLTAGE-CONTROLLED CRYSTAL OSCILLATOR IN A PHASE CONTROL CIRCUIT

[75] Inventor: Eduard Zwack, Puchheim, Fed. Rep. of Germany

[73] Assignee: Siemens Aktiengesellschaft, Berlin and Munich, Fed. Rep. of Germany

[21] Appl. No.: 250,708

[22] Filed: Sep. 28, 1988

[30] Foreign Application Priority Data

Sep. 28, 1987 [DE] Fed. Rep. of Germany ....... 3732627

[51] Int. Cl.$^4$ .............................................. H03L 1/04
[52] U.S. Cl. ......................................... 331/176; 331/69
[58] Field of Search ...................... 331/25, 69, 70, 176

[56] References Cited

U.S. PATENT DOCUMENTS

| | | | |
|---|---|---|---|
| 3,409,841 | 11/1968 | Munn | 331/176 X |
| 4,479,096 | 10/1984 | Fowks | 331/70 X |
| 4,593,258 | 6/1986 | Block | 331/176 |

OTHER PUBLICATIONS

Publication by R. A. Katritzky, "ZVEI", pp. 148–149, Vistas Verlag, Berlin, 1985.

Primary Examiner—Eugene R. LaRoche
Assistant Examiner—Robert J. Pascal
Attorney, Agent, or Firm—Hill, Van Santen, Steadman & Simpson

[57] ABSTRACT

A heating or, respectively, cooling device is realized by a Peltier element and is assigned to a crystal oscillator and driven by a processor with the assistance of a temperature sensor such that the crystal exhibits one of two selected temperatures lying closest to the ambient temperature. A compensation value is stored in the memory of the processor for each of the crystal temperatures selected from an operating temperature range. This compensation value effects the compensation of the frequency deviations of the crystal oscillator that are caused by temperature fluctuations.

7 Claims, 2 Drawing Sheets

METHOD FOR TEMPERATURE COMPENSATION OF A VOLTAGE-CONTROLLED CRYSTAL OSCILLATOR IN A PHASE CONTROL CIRCUIT

BACKGROUND OF THE INVENTION

1. Field of the Invention

The present invention relates to a method for temperature compensation of a voltage-controlled crystal oscillator in a phase locked loop circuit, in which the digital output signals of the crystal oscillator are compared to digital reference clock signals with respect to phase and are supplied to a processor which is equipped with a memory.

2. Description of the Related Art

The individual system components in digital communications networks, such as switching and transmission equipment, are equipped with clock generators. These clock generators provide time control of the internal operations or procedures of the system components. In order to achieve frequency synchronism between the individual system components, clock information generated by a central, high-precision clock device is communicated to the system components via the existing transmission links and transmission equipment and is used for synchronization of the implemented clock generators. Such frequency synchronization devices are known as phase frequency control circuits, referenced below as phase locked loop (PLL) devices.

A PLL device essentially contains a voltage-controlled oscillator and a phase comparator with a following filter. The comparator compares the output signals of the oscillator to the clock information in terms of their phases and controls the oscillator depending on the result of the comparison. The oscillator is predominantly in the form of a crystal oscillator, whereby the properties of the crystal that critically influence the precision of an oscillator are taken into consideration. In greater detail, these properties are its temperature dependency and the modification of the crystal properties that are produced by aging. The temperature dependency of the crystal results in temperature fluctuations of the crystal caused by changes in the ambient temperature producing deviations in the frequency of the oscillator. The frequency deviations, which are dependent on crystal temperature, follow temperature response curves that are permanently assigned to each crystal. The temperature dependency of the crystal is essentially dependent on the type of crystal section, i.e. the angle relative to a crystal axis at which the crystal is cut from a quartz crystal. Since the frequency range of the PLL devices in digital telecommunications network components usually lies above 1 MHz, crystals having what are referred to as "AT sections" are used.

Methods are known with which the frequency deviations that are produced by temperature fluctuations can be compensated. Such a method is described in the ZVEI publication, Schwingquarze, ein unverzichtbares Bauelement in der Elektronik, Conference Documentation of the Quartz Symposium, 1985. The crystal is thereby thermally coupled to a temperature sensor of a temperature measuring device. The measured values which are present in analog form are digitized in an analog to digital (A/D) converter and are supplied to a memory in which the voltage values required for compensation are stored in digital form. Each digitized measured value has a digital compensation value assigned thereto. After a digital to analog (D/A) conversion, the compensation value is fed to the voltage control input of the oscillator as an analog compensation voltage and effects a correction of the temperature-conditioned frequency deviations. The frequency deviations of the oscillator produced due to temperature fluctuations can therefore be compensated with this digital compensation method.

An oscillator constructed in this manner can also be utilized in a PLL device. When so used, it is thereby to be considered particularly advantageous to replace the memory with a processor which is equipped with a memory, since, in addition to the temperature compensation of the crystal, the processor can perform correction of the oscillator, such correction being required due to the frequency deviations or, respectively, phase deviations of the two clock signals.

It is also known not to assign a compensation value in the memory to each temperature step defined by the A/D converter. The appropriate compensation values are stored for a selected plurality of crystal temperatures within the selected range of operating temperature, for example −20° C. through +70° C. The plurality of crystal temperatures for which compensation values are stored is based, for example, on the curvature of the temperature response curve of the crystal, since the compensation values for the crystal temperatures currently measured that lie between the selected crystal temperatures are calculated by linear interpolation. This basis on the curvature is required due to the pronounced curvatures of the temperature response curve of more selected crystal temperatures in order to keep the interpolation errors low. The respective intermediate value is thereby to be calculated for each voltage step defined by the A/D converter.

SUMMARY OF THE INVENTION

The object of the present invention, therefore, is to provide a method such that both the memory capacity-intensive storing of compensation values per A/D converter voltage step, as well as the computer-intensive, linear interpolation, are avoided.

According to the present invention, the above object is achieved in a system of the type set forth above which is particularly characterized in that the voltage-controlled crystal oscillator has a heating or, respectively, cooling device that influences the crystal temperature assigned thereto, and the processor controls the heating or, respectively, cooling device with the assistance of the temperature measuring device such that the crystal exhibits a prescribed temperature that lies closest to the ambient temperature.

The essential idea of the invention is that the crystal of the crystal oscillator is brought to one of two selected crystal temperatures lying closest to the ambient temperature with a heating or, respectively, cooling device. What is thereby effected is that, given outage of the reference clock signals, the stored compensation values for the selected crystal temperatures are directly useable for forming the drive voltage for the voltage-controlled crystal oscillator without additional calculations or, respectively, interpolations. The advantages of the temperature compensation method, forming compensation values, and the advantages of the heatable oscillator, holding the crystal constant at a prescribed temperature, are ideally utilized by the method of the present invention. The disadvantages of temperature compensation, high memory capacity requirement for storing all compensation values or considerable computational requirements given interpolation methods, and the disadvantages of the heatable crystal, enormous energy consumption due to heating beyond the range of operating temperature, however, are avoided.

A further advantage of the invention is that, when the crystal oscillator is placed in operation, a minimum heating or, respectively, cooling time is required in order to drive the crystal oscillator to the closest, selected crystal temperature, whereby the time interval in which the crystal oscillator can exhibit greater frequency deviations is kept optimally short.

Given employment of the crystal oscillator in a phase locked loop, furthermore, the compensation values that serve for the temperature compensation of the crystal are kept optimally low in view of the voltage value in order to be able to compensate great frequency deviations of the oscillator signals from the reference clock signals in an optimum manner. A crystal is thereby preferably selected wherein a required frequency deviation is not transgressed within a prescribed range of operating temperature. These are predominately crystals having "AT sections" of 2° through 4°. Due to the fast aging of crystals, considerable modifications in the frequency response curves occur. These modifications make an up-dating of the compensation values seem desirable. A further advantage of the invention may then be seen in that the compensation values are up-dateable for the selected crystal temperatures during operation. For calculating the current compensation values, two status conditions frequently occurring during operation are required. First of all, this is the presence of the reference clock signals and, secondly, a coincidence of the phase relation of the frequency clock signals with the oscillator signals. When both pre-conditions are present, then the digitized drive voltage of the voltage-controlled crystal oscillator represents the current compensation value for the currently-selected crystal temperature. As a current compensation value into which the changes due to the crystal aging are now incorporated, this is calculated and stored in a memory area that is respectively assigned to the currently-selected crystal temperature. As a consequence of the changing ambient temperature, different selected crystal temperatures are set during operation, and a current compensation value is then calculated and stored under the aforementioned conditions.

A heating as well as a cooling effect can be achieved with the assistance of a Peltier element. The cooling or heating effect depends on the direction of the current through the Peltier element and depends on the intensity of the current. The selected crystal temperature that lies closest to the ambient temperature of the crystal oscillator can be set with the assistance of this Peltier element. This means that a selected crystal temperature can be set with minimum power, i.e. heating or cooling power.

Instead of a heating or, respectively, cooling device, the method of the present invention can also be realized with a simple heating device. For example, a transistor can be provided as the heating device. Given utilization of a heating device, the processor must control the heating device with the assistance of the temperature measuring device such that the crystal exhibits the selected temperature that is the next lying above the ambient temperature. This feature can, in fact, be realized with little expense; however, it does cause a power consumption that is somewhat higher on average, but that can be reduced again by increasing the number of selected crystal temperatures.

A further significant advantage of the invention lies in the simple, first-time identification of the compensation values of the crystal. With the heating or, respectively, cooling device, realized by the Peltier element, the crystal is brought to a selected crystal temperature, beginning with the highest or lowest crystal temperature in a meaningful manner. After a selected crystal temperature has been reached, high-constancy reference clock signals are compared to the crystal oscillator signals. The crystal oscillator drive voltage is then varied until the frequency of the frequency clock signals and the frequency of the oscillator signals are identical. The crystal oscillator drive voltage that is reached last represents the appertaining compensation value for the selected crystal temperature. This compensation value is respectively stored in one of the memory areas of the processor assigned to the selected crystal temperatures. This procedure is analogously executed for the further, selected crystal temperatures. If the heating or, respectively, cooling effect of the Peltier element utilized does not suffice, then a further, high-performance Peltier element can be thermally connected in series. The direct heating or, respectively, cooling of the crystal creates conditions as exist during later operation of the crystal. Furthermore, the employment of expensive air-conditioning units is avoided, wherein, moreover, the crystal oscillator is heated or cooled proceeding from the exterior, whereby operating conditions that do not exactly correspond to the later operating conditions are created in view of temperature generation and distribution.

BRIEF DESCRIPTION OF THE DRAWINGS

Other objects, features and advantages of the invention, its organization, construction and operation will be best understood from the following detailed description, taken in conjunction with the accompanying drawings, of which.

DESCRIPTION OF THE PREFERRED EMBODIMENTS

Figure 1:
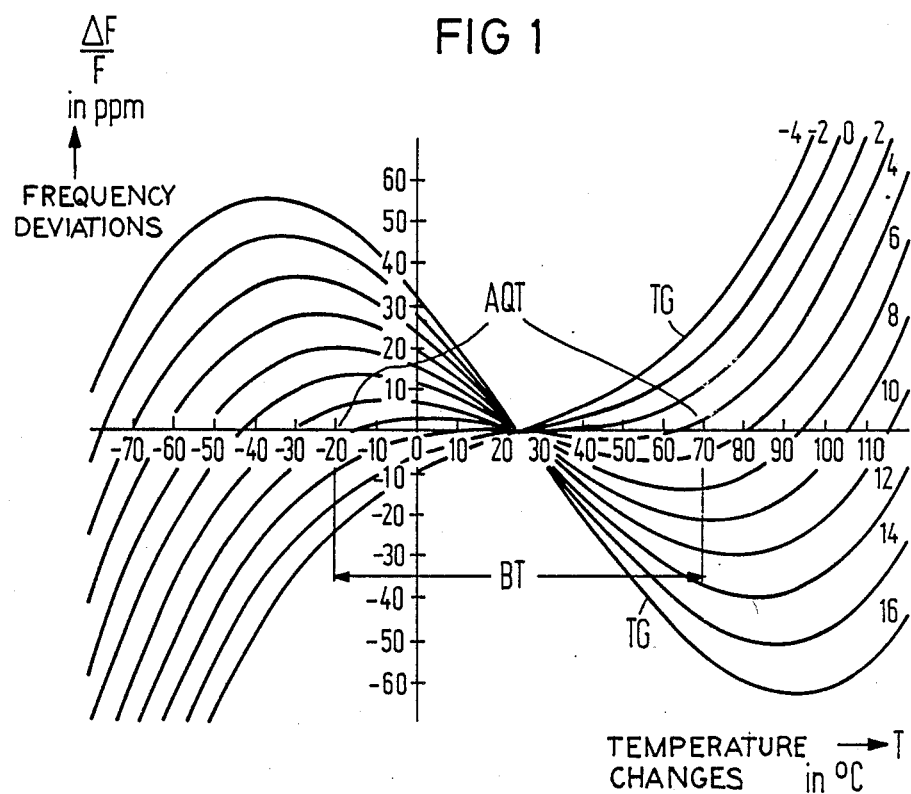
FIG. 1 is a graphic illustration of the temperature dependency of the frequency of crystals which have an "AT section"

FIG. 1 illustrates a plurality of temperature response curves TG of crystals having an "AT section". The temperature response curves TG are shown in an X/Y coordinate system, whereby the X axis illustrates the temperature changes T of the crystal in degrees Celsius (°C.) and the frequency deviations $\Delta F$ from the nominal frequency F of the crystal are recited in ppm (parts per million) on the Y axis. An operating temperature BT is assumed which extends from $-20°$ C. through $+70°$ C. for this exemplary embodiment. Given utilization of a crystal in a phase locked loop, a crystal is to be selected whose maximum frequency deviations $\Delta F$ are lowest in a prescribed operating temperature range BT. As may be seen from FIG. 1, the temperature response curve TG of a crystal having an "AT section" of 2° comes closest to the required conditions. Furthermore, it is also assumed for the exemplary embodiment that the selected crystal temperatures AQT are regularly distributed over the operating temperature range BT in steps of 5° C. Nineteen compensation values to be stored thereby occur.

Figure 2:
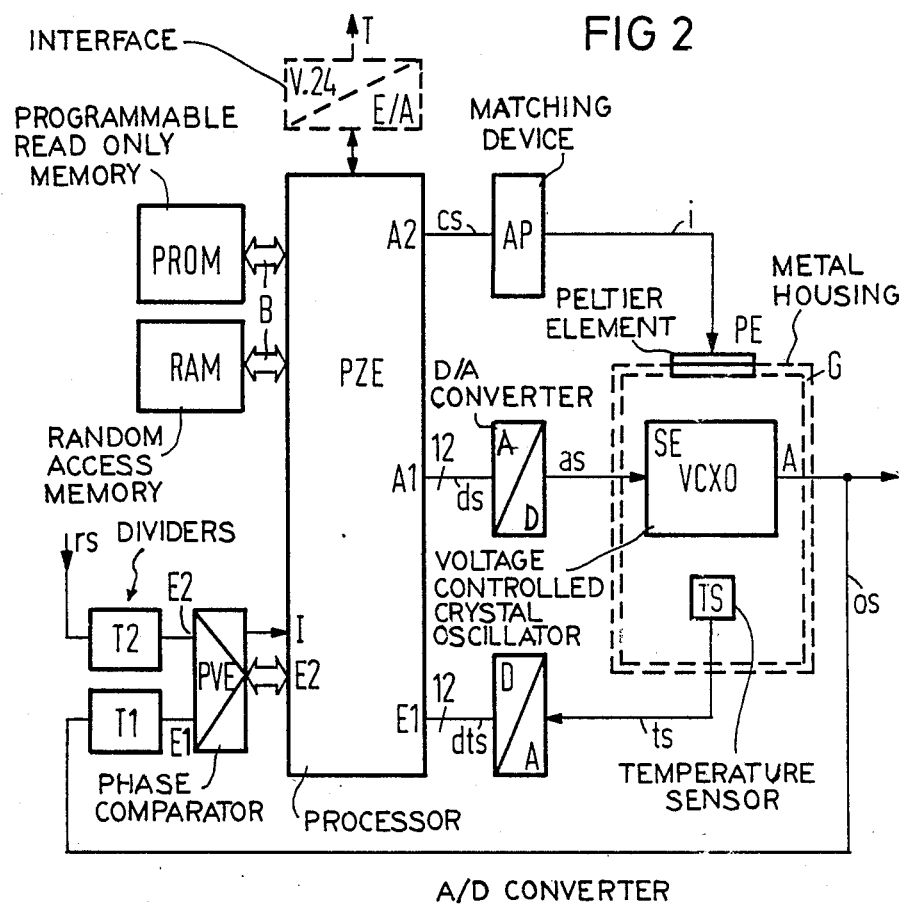
FIG. 2 is a block circuit diagram of a phase locked loop.

The crystal selected according to FIG. 1 is then contained in a voltage-controlled crystal oscillator VCXO shown in FIG. 2. This voltage-controlled oscillator VCXO, for example, is composed of an integrated oscillator circuit, of the selected crystal, as well as a pulling circuit with which the oscillator frequency is controllable within prescribed limits. Since the pulling circuit is essentially realized by capacitance diodes, a frequency modification is achieved by varying a dc voltage that is applied to a voltage input SE of the voltage-controlled crystal oscillator VCXO. The voltage-controlled crystal oscillator VCXO, referred to below simply as the oscillator VCXO, is accommodated in a metal housing G together with a temperature sensor TS. A Peltier element PE is arranged with a form fit at one of the sides of the metal housing G. The other sides of the metal housing G are provided with a thermal insulation in order to prevent a radiation of the heat or, respectively, cooling present in the metal housing. Proceeding on the basis of the selected, 5° C. crystal temperature steps, the heating or, respectively, cooling power of the Peltier element PE is to be dimensioned such that a maximum temperature difference of ±3° C. relative to the ambient temperature is effected in the metal housing G. Both the control input SE of the oscillator VCXO and the output ts of the temperature sensor TS are each connected to an A/D converter. The measured analog temperature signals ts coming from the temperature sensor ts are thereby converted into digital measured temperature signals dts and are supplied to an input E1 of a processor PZE. The voltage signals ds, digitized in the processor PZE are converted into analog voltage signals as in a second D/A converter and are supplied to the control input SE of the oscillator VCXO. The electrical outputs of the Peltier element PE are connected to a matching device AP that is likewise connected to the processor PZE. In the matching device AP, digital control signals cs coming from the processor PZE are converted into an analog current i and, dependent upon whether a heating or cooling effect is to be achieved and on its intensity, the corresponding current direction and the corresponding current intensity are set.

The oscillator signals os output at the output A of the oscillator VCXO are fed by way of a first divider T1 to a first input E1 of a phase comparison device PVE. By way of a second divider T2, a reference clock signal rs is fed to a second input E2 of the phase comparator PVE. For example, the reference clock signal rs is derived from the information received by transmission equipment and regenerated. The reference clock signals rs and the oscillator signals os are compared in terms of phase in the phase comparator PVE. The result of the comparison proceeds via an appropriately-arranged connection to a second input E2 of the processor PZE.

A programmable read only memory (PROM) for storing the operating system programs and a random access memory (RAM) for storing data and user programs are assigned to the processor PZE which is realized as a microprocessor. Both memories PROM and RAM are connected to the processor PZE via a bus system B formed of control, address and data lines. For example, the processor PZE can be realized with the Siemens Microprocessor System 8051. The core unit of this microprocessor system 8051 is formed by an 8 bit (single chip) microcomputer 8051. In addition to the central unit (CPU central processor unit), the clock generator, an input/output device and a RAM memory are integrated in this microprocessor. The matching device AP and the two analog/digital converters are connected via the input/output device (not shown) of the microprocessor PZE. In the A/D converters, for example, analog information is converted into digital information that is 12 bits wide. The A/D converters are therefore each connected to the processor PZE via 12 lines. Since the input/output device of the processor PZE does not comprise this many terminals, the 12 lines are connected to 12 inputs of the input/output device via a known multiplexer device (not shown) controlled by the processor PZE. In order to be able to communicate with the processor PZE via an external terminal, the processor PZE can be equipped with a V0.24 interface. Specific inputs or, respectively, outputs of the input/output device are thereby defined as V0.24 interface lines and are fed to an externally-arranged V0.24 plug connector via a matching device that converts the internal transistor-to-transistor logic (TTL) signals into V0.24-suitable signals. A suitable program (already realized for such microprocessor systems) is to be implemented for the realization of the V0.24 transmission procedure, as well as for the editing of the data of the received signals as well as the data to be transmitted.

With the first and second dividers T1 and T2 and the phase comparator PVE, the reference clock signals rs are compared to the oscillator signals os in view of their phases and the result of the comparison is communicated to the processor PZE via the system bus B composed of data and control lines. Fundamentally, the size of the phase deviation is determined in a hardware manner with the first and second dividers T1 and T2 and the phase comparator PVE and this is communicated to the processor PZE at a defined point in time via a INTERRUPT INPUT. A digital control signal that represents the compensation value is formed in the processor PZE dependent on the phase deviation, being formed with a program realizing a proportional integration (PI) control element, and is fed to the voltage input SE of the oscillator VCXO via a D/A converter. This control signal is dimensioned such that phase coincidence between the reference clock signals rs and the oscillator signal os is achieved. At the same time, the control signal is stored as a compensation value in a memory area assigned to the selected crystal temperature and, given outage of the reference clock signals, is employed for direct drive of the oscillator VCXO at the correspondingly-selected crystal temperature.

The temperature within the metal housing G is measured with the temperature sensor TS, realized, for example, with a semiconductor temperature sensor and an analog matching circuit. The temperature information is supplied to the processor PZE via the A/D converter. When the oscillator VCXO is placed in operation, the oscillator temperature will correspond to the ambient temperature of the phase locked loop. For example, it is assumed that this temperature is +22° C. As a result of the selected crystal temperatures, in 5° C. steps within the operating temperature range as initially defined, the selected crystal temperature +20° C. lies nearest to the currently-measured temperature. Together with the matching device AP, the processor PZE drives the Peltier element PE such that a cooling effect is achieved. The oscillator VCXO is cooled until the selected crystal temperature of +26° C. is reached. This set, selected crystal temperature is kept constant by corresponding drive of the Peltier element PE as long as an admissible current intensity through the Peltier element PE that indicates the rise or drop in the ambient temperature is not transgressed.

When, for example, the ambient temperature rises to +24° C., then the housing G containing the oscillator VCXO must be cooled by 4° C. This means a current intensity through the Peltier element PE that lies above an allowable current intensity with which the housing G is heated or cooled by a maximum of ±3° C. proceeding from the currently-measured crystal temperature. As a result of the transgression of the admissible current intensity for cooling the housing G, the Peltier element PE is not driven such that the next-highest selected crystal temperature of 25° C. is set. As a result thereof, the current intensity through the Peltier element PE again falls below the value that lies within the allowable range of current intensity. For example, this method for temperature control of the oscillator is stored in the processor PZE as a user program.

What the method of the present invention then achieves is that the temperature difference between the ambient temperature and the selected crystal temperature is at its lowest and the compensation values stored for the selected crystal temperatures are directly employable for forming the drive information of the oscillator VCXO given outage of the reference clock signals rs. This drive information ds is represented by digitized voltage values that are supplied to the oscillator VCXO after a digital/analog conversion in a digital/analog converter D/A.

The following table contains possible realizations for the individual system components of the phase locked loop by way of example.

| SCHEDULE OF COMPONENTS | |
|---|---|
| Processor PZE | Siemens single chip 8051 with reset circuit TL7705 data line driver 74ALS 373 address driver 74ALS 245 of advanced low power Schottky circuits. |
| Crystal Oscillator | 16.384 MHz KVG (Kristallverarbeitung Neckarbischofsheim (GmbH) |
| Temperature Measuring Device TS | Temperature Sensor AD590 and amplified AD524 (Intersil Company) |
| Digital-to-Analog Converter D/A | Intersil Company AD574 and AD667 |
| Phase Comparator PVE | 74ALS374 (D-register) |
| Divider T1, T2 | 74ALS160 and 74ALS161 Binary or, respectively, Decade counter |
| V.24 Interface Modules | Siemens SN74188 and SN75189 |

Although I have described my invention by reference to particular embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method for temperature compensation of a voltage-controlled crystal oscillator which includes a crystal in a phase locked loop circuit, comprising the steps of:

controlling the temperature of the crystal oscillator by a heating-cooling device;
   sensing the temperature of the crystal oscillator and feeding signals resulting therefrom to a processor;
   controlling the heating-cooling device by said processor to a selected temperature of the crystal oscillator lying closest to a current ambient temperature.

2. A method as claimed in claim 1, further comprising the step of:
   selecting a crystal which is constructed such that its frequency deviation ΔF does not exceed a required value within a selected operating temperature.

3. The method of claim 1, and further comprising the steps of:
   given the presence of reference clock signals during operation of the phase locked loop circuit:
   calculating compensation values and storing the compensation values and current compensation values in the memory of said processor with respect to a prescribed crystal temperature.

4. The method of claim 1, and further comprising the step of, for heating or cooling:
   driving a Peltier element with a current whose direction defines cooling or heating and whose current intensity defines the intensity of cooling or heating.

5. A method of claim 1, wherein:
   said heating-cooling device is a heating device and said processor controls said heating device such that, with the assistance of a temperature sensing device, the crystal oscillator exhibits a prescribed temperature that is next to and above the ambient temperature.

6. The method of claim 3, for the purpose of initial identification of compensation values of a crystal oscillator, and further comprising the steps of:
   supplying high-consistency reference clock signals to the phase locked loop;
   setting a crystal temperature to prescribed crystal temperature steps by an external control of the heating-cooling device, whereby crystal oscillator drive voltages represent the compensation values for the respective, prescribed crystal temperature step; and
   storing the compensation values in a memory area assigned to the prescribed crystal temperatures.

7. Apparatus for temperature compensation of a voltage-controlled crystal oscillator in a phase control circuit, comprising:
   a voltage-controlled crystal oscillator and a thermally-insulated housing encompassing the said voltage-controlled crystal oscillator;
   a Peltier element in said housing;
   a temperature sensor in said housing and operable to sense the temperature of said crystal and produce corresponding analog signals;
   an analog-to-digital converter connected to said temperature sensor for providing digital signals corresponding to said analog signals;
   a processor connected to said analog-to-digital converter connected to receive reference clock signals and the output clock signals of said oscillator;
   first and second dividers for receiving said reference clock signals and said output clock signals;
   a phase comparator connected to said dividers for receiving the output signals thereof;
   a processor connected to said comparator for processing the output signals thereof with respect to the digital output signal of said analog-to-digital converter; and a matching device connected between said processor and said Peltier element and operable to drive said Peltier element to heat or cool said crystal with respect to the temperature sensed by said temperature sensor.

* * * * *